United States Patent [19]

Garrity et al.

[11] Patent Number: 5,894,284
[45] Date of Patent: Apr. 13, 1999

[54] COMMON-MODE OUTPUT SENSING CIRCUIT

[75] Inventors: Douglas A. Garrity, Gilbert, Ariz.; Patrick L. Rakers, Kildeer, Ill.

[73] Assignee: Motorola, Inc., Schaumburg, Ill.

[21] Appl. No.: 08/753,812

[22] Filed: Dec. 2, 1996

[51] Int. Cl.[6] .................................................. H03M 1/44
[52] U.S. Cl. ........................ 341/172; 327/337; 341/162
[58] Field of Search ................................... 341/155, 172, 341/162; 327/337

[56] References Cited

U.S. PATENT DOCUMENTS

| | | | |
|---|---|---|---|
| 4,968,988 | 11/1990 | Miki et al. | 341/141 |
| 4,988,900 | 1/1991 | Fensch | 341/150 |
| 4,989,002 | 1/1991 | Tan | 341/120 |
| 5,057,839 | 10/1991 | Koch | 341/143 |
| 5,068,660 | 11/1991 | Swanson et al. | 341/143 |
| 5,126,961 | 6/1992 | Garverick | 364/724.1 |
| 5,159,341 | 10/1992 | McCartney et al. | 341/143 |
| 5,239,299 | 8/1993 | Apple et al. | 341/118 |
| 5,510,789 | 4/1996 | Lee | 341/120 |
| 5,541,602 | 7/1996 | Opris et al. | 341/161 |
| 5,617,093 | 4/1997 | Klein | 341/172 |
| 5,703,589 | 12/1997 | Kalthoff et al. | 341/172 |
| 5,790,064 | 8/1998 | Fujimori | 341/172 |

OTHER PUBLICATIONS

A. Karanicolas et al., IEEE Journal of Solid–State Circuits, "A High–Frequency Fully Differential BiCMOS Operational Amplifier", vol. 26, No. 3, Mar. 1991, pp. 203–208.

*Primary Examiner*—Marc S. Hoff
*Attorney, Agent, or Firm*—Sharon K. Coleman; Robert D. Atkins

[57] ABSTRACT

A common-mode sensing circuit (504) of a clocked differential amplifier (602) includes a refresh circuit (604) which precharges a capacitance during a first clock phase ($P_1$) and discharges the capacitance to drive the outputs (514, 516) of the differential amplifier (602) to a desired common-mode voltage ($V_{AGO}$) during a second clock phase, which increases the output loading during the second clock phase ($P_2$). A load balancing circuit (606) selectively switches a load to the outputs (514, 516) during the first clock phase ($P_1$) to match the load produced by the refresh circuit (604) during the second clock phase ($P_2$).

21 Claims, 3 Drawing Sheets

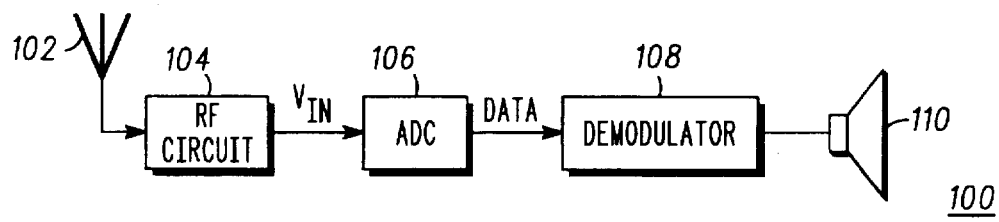
FIG. 1
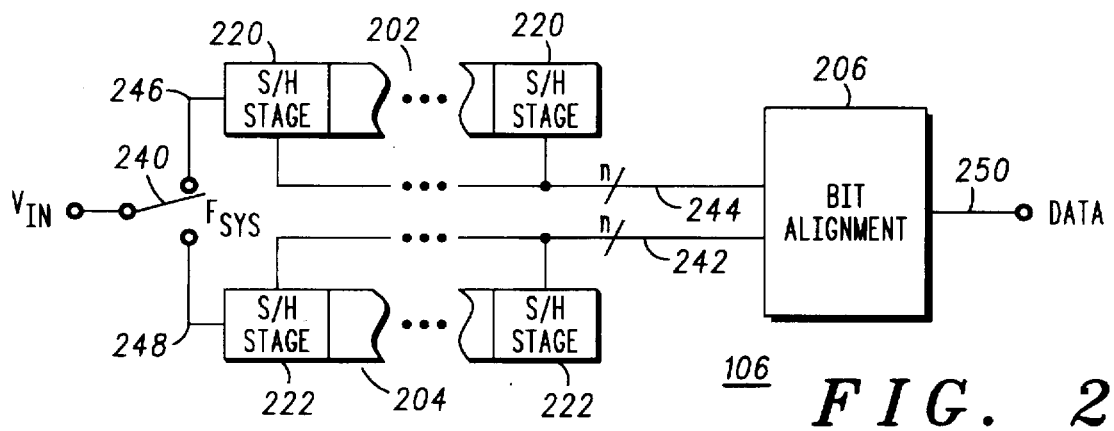
FIG. 2
FIG. 3
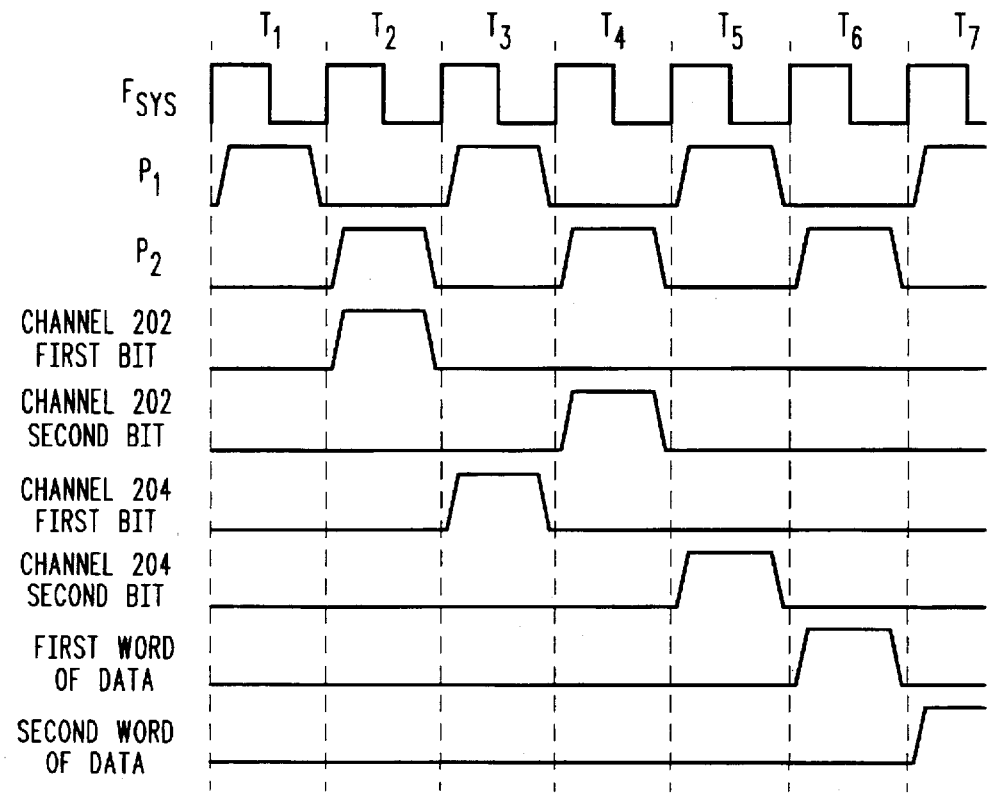

COMMON-MODE OUTPUT SENSING CIRCUIT

BACKGROUND OF THE INVENTION

The present invention relates in general to integrated circuits and, more particularly, to sensing a common-mode voltage of a clocked differential amplifier.

Signal processing functions are often implemented more economically using digital rather than analog methods. For example, a wireless communication device such as a cellular telephone or pager often uses fewer external tuning components if a transmitted carrier signal is converted to digital data at an early stage in the communication device. A high frequency analog-to-digital converter (ADC) is used for converting the analog carrier signal to a digital data stream. A demodulated signal is computed from the digital data stream using a preprogrammed demodulation mathematical algorithm.

A typical high frequency ADC includes a plurality of parallel time-interleaved, pipelined ADC channels which sample the carrier signal at alternating time points and produce data words representative of the amplitude of the analog carrier signal at the time of the sample. The data words from each channel are interleaved to form the digital data stream. A low data error rate requires symmetry among the parallel channels, including carefully matched components and timing signals.

Analog signals are processed through each channel in a series of pipelined sample-and-hold stages. A clocked differential amplifier in each sample-and-hold stage processes an analog input signal to produce a residue signal that is clocked to the next stage using switched capacitors enabled on alternate clock phases. Control of common-mode voltages is needed to maintain the analog signals within the operating ranges of the differential amplifiers, which is provided by periodically refreshing the common-mode voltages to desired levels with a common-mode sensing circuit. However, prior art common-mode sensing circuits produce different loads at the outputs of the differential amplifiers during the alternate clock phases. The difference in loading results in output spurs in the differential amplifier frequency response, which produces data errors and incorrect demodulation of the carrier signal.

Hence, there is a need for a common-mode sensing circuit which reduces output spurs and data errors.

BRIEF DESCRIPTION OF THE DRAWINGS

FIG. 1 is a block diagram of a wireless communication device;

FIG. 2 is a block diagram of a time-interleaved, pipelined analog-to-digital converter;

FIG. 3 is a timing diagram showing timing signals in an analog-to-digital converter;

DETAILED DESCRIPTION OF THE DRAWINGS

Figure 4:
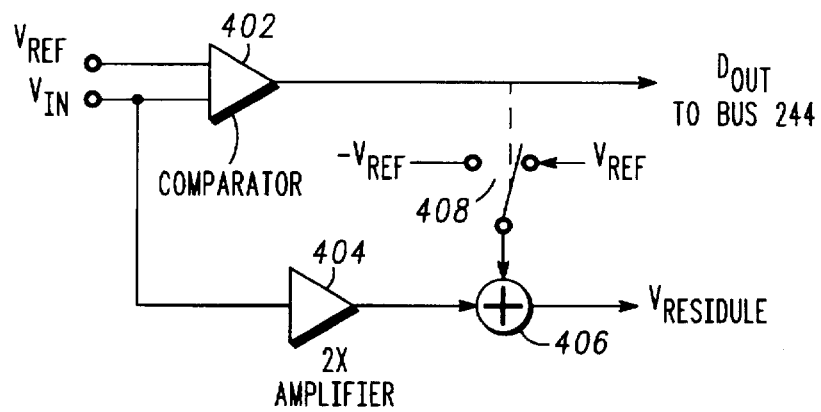
FIG. 4 is a functional block diagram of an analog-to-digital converter stage.

FIG. 1 shows a block diagram of a wireless communications device 100 such as a cellular telephone or pager. A receiver circuit in communications device 100 includes an antenna 102 and a radio frequency (RF) circuit 104. Antenna 102 receives a transmitted RF carrier signal modulated with audio and control information. RF circuit 104 amplifies the RF carrier signal and converts the frequency down to an analog intermediate frequency (IF) signal designated as $V_{IN}$ within the frequency range of an analog-to-digital converter (ADC) 106. ADC 106 periodically samples IF signal $V_{IN}$ at an input and produces a digital data stream DATA comprising data words that represent the amplitudes of $V_{IN}$ at different sampling times. A demodulator 108 comprises a micro-controller which executes a preprogrammed mathematical demodulation algorithm stored in memory (not shown) to recover an audio signal that drives a speaker 110.

FIG. 2 shows a block diagram of ADC 106 comprising parallel time-interleaved channels 202 and 204 and a bit alignment circuit 206. Elements having the same reference numbers provide similar functions. The switches designate analog switching devices such as a transmission gate or field-effect transistor having control inputs (not shown) for providing a conductive path for an analog signal. Switch 240 couples analog input signal $V_{IN}$ to an input 246 or to an input 248 on alternate clock phases $P_1$, and P2 derived from system clock $F_{SYS}$. In particular, $V_{IN}$ is coupled through switch 240 to input 246 of ADC channel 202 during clock phase $P_1$, and to input 248 of ADC channel 204 during clock phase $P_2$.

Operation of ADC 106 is understood by referring to the timing diagram of FIG. 3, which shows the relationship of clock phases $P_1$ and $P_2$ to system clock $F_{SYS}$. Clock phases $P_1$ and $P_2$ are non-overlapping clock signals derived from $F_{SYS}$ but operating at one-half the frequency.

Channel 202 comprises an array of n binary-weighted, pipelined ADC stages 220, each of which samples an analog input signal which is resolved to produce one bit of a digital word on a conductor of a n-bit bus 244, where n is an integer that represents the desired resolution. In a typical channel 202, n=10. An analog residue signal produced by each ADC stage 220 is shifted to the next stage in the fashion of an analog shift register clocked by clock phases $P_1$ and $P_2$. It should be noted that a pipelined ADC can alternatively be configured to implement a different conversion algorithm, such as the redundant signed digit algorithm, which provides a greater number of bits per stage.

Channel 204 comprises an array of n binary-weighted, pipelined ADC stages 222, each of which samples an analog input signal which is resolved to produce one bit of a digital word on a conductor of a n-bit bus 242, where n is an integer that represents the desired resolution. In a typical channel 204, n=10. An analog residue signal produced by each ADC stage 222 is shifted to the next stage in the fashion of an analog shift register clocked by clock phases $P_2$ and $P_1$. ADC stages 222 are matched to ADC stages 220.

The most significant bit (MSB) of a data word is resolved during clock phase $P_2$ by the first ADC stage 220 coupled to input 246, with subsequent stages resolving bits of decreasing significance. FIG. 3 shows an example of data bit timing for an ADC 106 having two-bit resolution, so that channel 202 has two ADC stages 220. Assume $V_{IN}$ is sampled during time interval $T_1$ and the two ADC stages 220 resolve data bits each having a logic value of "1". Waveform CHANNEL 202 FIRST BIT shows the MSB produced by the first ADC stage 220 during time interval $T_2$ on a first conductor of bus 244. Waveform CHANNEL 202 SECOND BIT shows the next significant bit being produced by the second ADC stage 220 during time interval $T_4$ on a second conductor of bus 244. The data bits produced by the first and second ADC stages 220 of channel 202 are produced at different times but correspond to the same $V_{IN}$ sample.

For the 2-bit example, channel 204 has two ADC stages 222 for performing similar functions as ADC stages 220 but with alternate clock phases. In particular, channel 202 samples during clock phase $P_1$ and produces data bits on bus 244 during clock phase $P_2$, whereas channel 204 samples during clock phase $P_2$ and produces data bits on bus 242 during clock phase $P_1$. FIG. 3 shows the data bit timing for the example of two ADC stages 222 of channel 204, with $V_{IN}$ sampled during time interval $T_2$ and the two ADC stages 222 resolving data bits each having a logic value of "1" Waveform CHANNEL 204 FIRST BIT shows the MSB produced by the first ADC stage 222 coupled to input 248 during time interval $T_3$ on a first conductor of bus 242. Waveform CHANNEL 204 SECOND BIT shows the next significant bit being produced by the second ADC stage 222 during time interval $T_5$ on a second conductor of bus 242. The data bits produced by the first and second ADC stages 222 are produced at different times but correspond to the same $V_{IN}$ sample.

In order to align the data bits generated at different times to produce a data word representative of the $V_{IN}$ sample, bit alignment circuit 206 includes a plurality of digital shift registers (not shown) which receive the data bits produced by each ADC stage 220 in channel 202 and each ADC stage 222 in channel 204. Each digital shift register shifts a data bit through digital stages in parallel with the ADC stages 220 and 222 through which the corresponding analog residue signals are shifted. The shift registers receiving data bits from channel 202 are shifted on clock phase $P_2$ and the shift registers receiving data bits from channel 204 are shifted on clock phase $P_1$. Just as analog residue signals produced at earlier stages are clocked and processed through more ADC stages 220 and 222, data bits which are generated earlier are clocked through more shift register stages, thereby synchronizing the data bits into a n-bit data word at n-bit output bus 250.

Referring to FIG. 3, a waveform is shown of a first word of DATA produced at output bus 250 during time interval $T_6$ from data bits generated in channel 202. For simplicity, a single waveform is shown even though in the two-bit example the first word of DATA has two bits. The waveform first word of DATA includes a first data bit produced by shifting CHANNEL 202 FIRST BIT through a two-stage shift register on clock phase $P_2$, and a second data bit produced by shifting CHANNEL 202 SECOND BIT through a one-stage shift register on clock phase $P_2$. The first data bit is thereby delayed by two pulses of clock phase $P_2$ and the second data bit is delayed by one pulse of clock phase $P_2$ so both the first and second data bits arrive at output bus 250 during time interval $T_6$. The first word of DATA represents the magnitude of the $V_{IN}$ sample taken at time interval $T_1$.

FIG. 3 further shows a waveform of a second word of DATA produced at output bus 250 during time interval $T_7$ from data bits generated in channel 204. For simplicity, a single waveform is shown even though in the two-bit example the second word of DATA has two bits. The waveform second word of DATA includes a first data bit produced by shifting CHANNEL 204 FIRST BIT through a two-stage shift register on clock phase $P_1$, and a second data bit produced by shifting CHANNEL 204 SECOND BIT through a one-stage shift register on clock phase $P_1$. The first data bit is delayed by two pulses of clock phase $P_1$ and the second data bit is delayed by one pulse of clock phase $P_1$ such that the first and second data bits arrive at output bus 250 at time interval $T_7$. The second word of DATA represents the magnitude of the $V_{IN}$ sample taken at time interval $T_2$.

Because of the interleaving architecture of ADC 106, input signal $V_{IN}$ is sampled at the frequency of system clock of $F_{SYS}$, while channels 202 and 204 operate at only one-half the $F_{SYS}$ frequency. Digital data stream DATA is generated by interleaving data words which are alternately produced by channel 202 and channel 204. The accuracy of data stream DATA in representing $V_{IN}$ at the sampling times depends on carefully matching corresponding components to produce symmetrical responses in channels 202 and 204. In particular, the ADC stages 220 and 222 preferably have the same frequency response during clock phase $P_1$ as during clock phase $P_2$ so that spurious data errors are not generated when data produced on different clock phases is interleaved to produce digital data stream DATA.

FIG. 4 is a functional block diagram showing the first ADC stage 220 of channel 202 including a comparator 402, an amplifier 404 and a summing circuit 406. The other ADC stages 220 in channel 202 and ADC stages 222 in channel 204 are matched to provide comparable performance. For simplicity, ADC stage 220 is shown as comprising single-ended circuitry. However, a typical integrated circuit embodiment uses fully differential circuits for improved power supply rejection and increased dynamic range.

Comparator 402 compares analog input voltage $V_{IN}$ to a reference voltage $V_{COMP}$, which is typically set to zero volts. For subsequent ADC stages 220 after the first stage, input signal $V_{IN}$ represents an analog residue signal produced by the previous ADC stage 220. An output provides a digital data bit $D_{OUT}$ at a conductor of bus 244. Comparator 402 includes an output buffer stage for driving the bus 244 conductor.

Amplifier 404 is configured to have a closed-loop gain of 2.0. Switch 408 switches either reference voltage $V_{REF}$ or a complementary reference voltage $-V_{REF}$ to a first input of summing circuit 406, according to whether $D_{OUT}$ has a logic value of "0" or "1", respectively. The output of amplifier 404 is coupled to a second input of summing circuit 406. Switch 408, amplifier 404 and summing circuit 406 combine to produce an analog residue signal $V_{RESIDUE}$ which is coupled to the input of the next ADC stage. The magnitude of residue signal $V_{RESIDUE}$ is given by the following equations.

$$V_{RESIDUE}=2.0*V_{IN}+(-V_{REF}) \text{ when } D_{OUT}=1 \quad (1)$$

$$V_{RESIDUE}=2.0*V_{IN}+(+V_{REF}) \text{ when } D_{OUT}=0 \quad (2)$$

Figure 5:
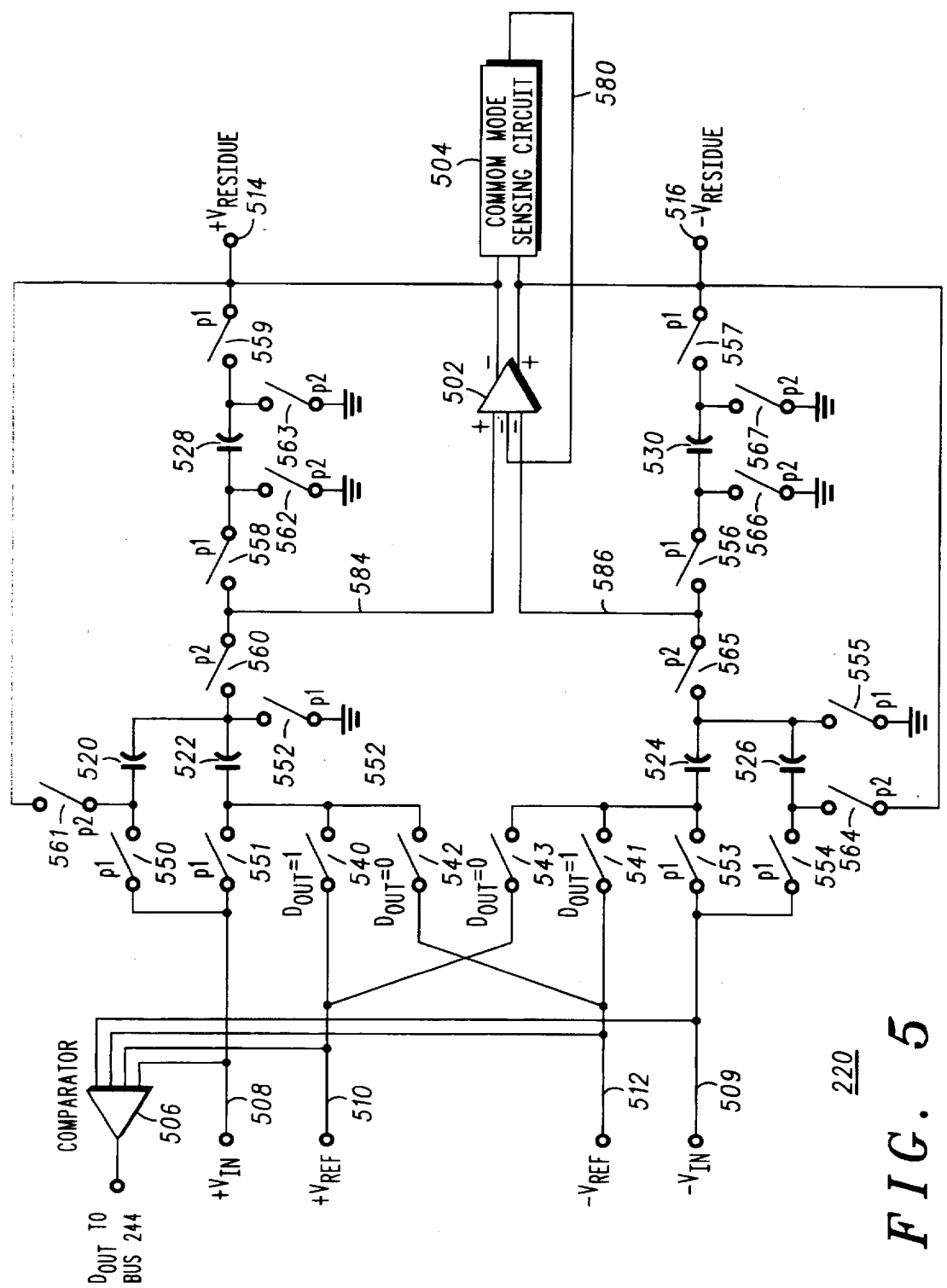
FIG. 5 is a schematic diagram of an analog-to-digital converter stage.

FIG. 5 is a schematic diagram showing a fully differential implementation of the first ADC stage 220 of channel 202, including an operational amplifier 502, a common-mode sensing circuit 504, a comparator 506, capacitors 520–530, and switches 540–578. Operational amplifier 502, common-mode sensing circuit 504, capacitors 520–530 and switches 540–578 provide a sample-and-hold function. An analog differential input signal $\pm V_{IN}$ is received across inputs 508 and 509, respectively. An analog differential residue signal $\pm V_{RESIDUE}$ is produced across outputs 514 and 516, respectively. Comparator 506 compares differential input signal $\pm V_{IN}$ to a differential reference signal $\pm V_{COMP}$ received across inputs 510 and 512 to produce a digital data bit $D_{OUT}$ on bus 244.

Operational amplifier 502 operates in a fully differential mode with capacitors 520, 522, 524 and 526 matched to provide a closed-loop gain of 2.0. In particular, capacitor 520 is matched in capacitance to capacitor 522 and capacitor 526 is matched in capacitance to capacitor 524. Capacitors 522 and 524 are matched and capacitors 520 and 526 are matched. In one embodiment, capacitors 520, 522, 524 and 526 have a capacitance of 1.0 picofarads each.

Data bit $D_{OUT}$ controls the conduction of switches 540–543. When $D_{OUT}$ has a "1" logic value, switches 540 and 541 are enabled or closed, i.e., conductive, and switches 542 and 543 are disabled or open, i.e., not conductive. When $D_{OUT}$ has a "0" logic value, switches 542 and 543 are closed and switches 540 and 541 are open. Switches 550–559 are closed by clock phase $P_1$, and switches 560–567 are closed by clock phase $P_2$.

During clock phase $P_1$, switches 560–567 are open. Switches 550–552 are closed to charge capacitors 520 and 522 to voltage $+V_{IN}$. Switches 553–555 are closed to charge capacitors 524 and 526 to voltage $-V_{IN}$. Switches 556–559 are closed to couple capacitors 528 and 530 from outputs 514 and 516 to inputs 584 and 586, respectively, for operating within the dynamic range of operational amplifier 502 for improved frequency response. After clock phase $P_1$, switches 550–559 are opened.

During clock phase $P_2$, switches 562 and 563 are closed to discharge capacitor 528 and switches 566–567 are closed to discharge capacitor 530. Switches 560, 561, 564 and 565 are closed, thereby coupling capacitor 520 between output 514 and input 584 and capacitor 526 between output 516 and input 586 to configure operational amplifier 502 to multiply differential input signal $\pm V_{IN}$ by a closed loop gain of 2.0. If $D_{OUT}$ has a logic value of "0", switches 542 and 543 are closed and differential reference voltage $\pm V_{REF}$ is summed with $2.0*(+V_{IN}-(-V_{IN}))$. If $D_{OUT}$ has a logic value of "1", switches 540 and 541 are closed and differential reference voltage $mV_{REF}$ is summed with $2.0*(+V_{IN}-(-V_{IN}))$. Analog differential residue signal $\pm V_{RESIDUE}$ is produced at outputs 514 and 516 in accordance with the equations $$V_{RESIDUE}-(-V_{RESIDUE})=2.0*(+V_{IN}-(-V_{IN}))+(-V_{REF}-(-V_{REF})) \quad 3)$$

$$V_{RESIDUE}-(-V_{RESIDUE})=2.0*(+V_{IN}-(-V_{IN}))+(+V_{REF}-(+V_{REF})) \quad 4)$$

where equation (3) is implemented when $D_{OUT}$ has a "0" logic value and equation (4) is implemented when $D_{OUT}$ has a "1" logic value. Operational amplifier 502 preferably has sufficient open-loop gain to generate essentially zero error when operating in the closed-loop mode.

For example, assume $+V_{IN}=3.50$ volts and $-V_{IN}=1.50$ volts, so that $\pm V_{IN}=2.0$ volts. Further assume $+V_{REF}=3.5$ volts and $-V_{REF}=1.5$ volts, so that $\pm V_{REF}=(+V_{REF}-(-V_{REF}))=2.0$ volts. Then $\pm V_{IN}=2.0$ volts is greater than $\pm V_{COMP}=0.0$ volts, which sets $D_{OUT}$ to a logic value of "1" and closes switches 540 and 541. During clock phase $P_1$, capacitors 520, 522, 524 and 526 are charged to differential voltage $\pm V_{IN}=(+V_{IN}-(-V_{IN}))=2.0$ volts. During clock phase $P_2$, $(+V_{IN}-(-V_{IN}))=2.0$ volts is multiplied by 2.0 and then summed with $(-V_{REF}-(+V_{REF}))=-2.0$ volts. As a result, output voltage $\pm V_{RESIDUE}=(+V_{RESIDUE}-(-V_{RESIDUE}))=2.0$ volts.

Input and output loading of operational amplifier 502 is substantially capacitive. During power up or after a circuit disturbance, the common-mode voltage levels at inputs 584 and 586 and at outputs 514 and 516 can exceed the dynamic range of operational amplifier 502. To maintain operational amplifier 502 at an optimum level within the operating range, common-mode sensing circuit 504 periodically refreshes inputs 584 and 586 and outputs 514 and 516 to desired common-mode levels. A deviation from the desired common-mode levels is sensed at a sensing node 580 and fed back to a common-mode inverting input of operational amplifier 502 to stabilize the input and output common-mode voltage levels.

Figure 6:
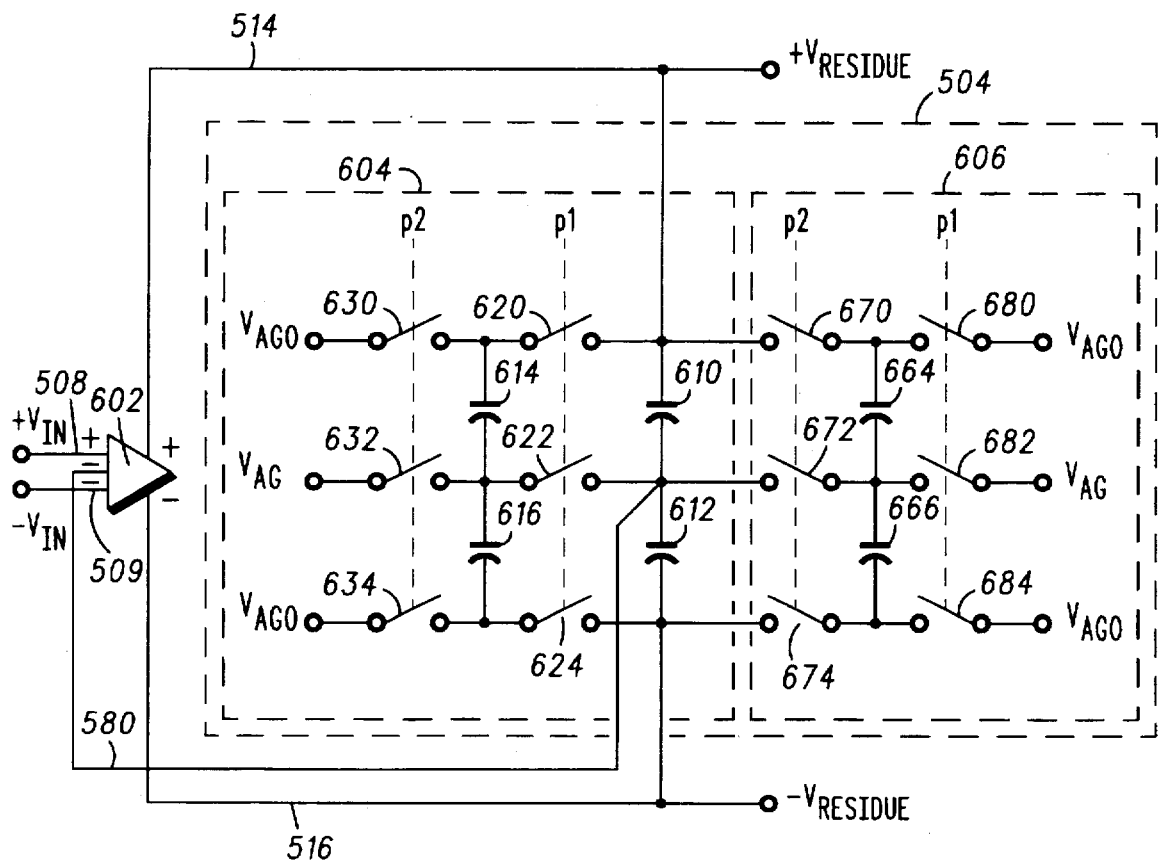
FIG. 6 is a schematic diagram of a differential amplifier coupled to a common-mode sensing circuit.

FIG. 6 is a schematic diagram showing a clocked differential amplifier 602 and further detail of common-mode sensing circuit 504. Differential amplifier 602 receives analog differential input signal $\pm V_{IN}$ across inputs 508 and 509 and produces analog differential output signal $\pm V_{RESIDUE}$ across outputs 514 and 516. Differential amplifier 602 includes a differential operational amplifier configured with switched capacitor circuits to operate with a closed loop gain of 2.0.

Differential amplifier 602 includes a common-mode feedback amplifier (not shown) having an inverting input coupled to sensing node 580 for maintaining the common-mode voltages of outputs 514 and 516 to a desired level typically at the midpoint of the operating range. Preferably, the voltage at sensing node 580 is developed across capacitors 610 and 612 so that the differential output range is not degraded. In order to reduce the recovery time of differential amplifier 602 from a circuit disturbance such as a noise spike, common-mode sensing circuit 504 periodically refreshes sensing node 580 to a desired input common-mode voltage $V_{AG}$ and outputs 514 and 516 to a desired output common-mode voltage $V_{AGO}$.

Common-mode sensing circuit 504 includes a refresh circuit 604 and a load balancing circuit 606. Refresh circuit 604 includes capacitors 610, 612, 614 and 616 and switches 620–624 and 630–634. Capacitor 614 combines with switches 620, 622, 630 and 632 to form a switched capacitor circuit and capacitor 616 combines with switches 622, 624, 632 and 634 to form a switched capacitor circuit.

During clock phase $P_2$, switches 630, 632 and 634 are enabled, thereby precharging capacitors 614 and 616 to voltage $V_{AGO}-V_{AG}$. During clock phase $P_1$, switches 620, 622 and 624 are enabled, thereby discharging capacitors 614 and 616 across capacitors 610 and 612 to drive outputs 514 and 516 to the desired output common-mode voltage $V_{AGO}$. By precharging on clock phase $P_2$ and discharging on clock phase $P_1$, outputs 514 and 516 are more heavily loaded during clock phase $P_1$ than during clock phase $P_2$. In particular, outputs 514 and 516 are loaded with capacitors 610, 612, 614 and 616 during clock phase $P_1$ and with only capacitors 610 and 612 during clock phase $P_2$.

The asymmetric loading causes differential amplifier 602 to have a different frequency response during clock phase $P_1$ than during clock phase $P_2$. In a single channel circuit such as a pipelined ADC, the different frequency response does not result in errors at high sampling rates because all of the differential stages are in the same channel and therefore perform the same function on the same clock phase. For example, all of the differential amplifiers in the channel sample analog signals during a first clock phase and produce output data during a second clock phase.

In a multiple channel time-interleaved application such as an ADC or switched capacitor filter, output data is produced by interleaving or merging data from multiple channels, such that different channels perform different functions during the same clock phase. Taking ADC 106 as an example, the ADC stages 220 in channel 202 sample input voltages during clock phase $P_1$ while the ADC stages 222 in channel 204 are producing data. Similarly, the ADC stages 222 in channel 204 sample input voltages during clock phase $P_2$ while the ADC stages 220 in channel 202 are producing data. Data is interleaved to form digital data stream DATA whose data words are produced during both clock phases $P_1$ and $P_2$. At high sampling rates, spurious data errors are generated in digital data stream DATA because ADC stages 220 of channel 202 have a different frequency response when sampling analog signals than the frequency response of ADC stages 222 of channel 204 when producing output data. The spurious data errors include missing or redundant codes in the transfer function of analog input signal to output data stream, which can occur even when components are carefully matched.

Load balancing circuit 606 equalizes the frequency responses of differential amplifier 602 during clock phases $P_1$ and $P_2$ by equalizing the load produced by refresh circuit 604 at outputs 514 and 516. Load balancing circuit 606 includes capacitors 664 and 666 and switches 670–674 and 680–684. Capacitor 664 combines with switches 670, 672, 680 and 682 to form a switched capacitor circuit and capacitor 666 combines with switches 672, 674, 682 and 684 to form a switched capacitor circuit. Capacitor 664 is matched to capacitor 614 and capacitor 666 is matched to capacitor 616.

In operation, switches 680, 682 and 684 are enabled by clock phase $P_1$, to precharge capacitors 664 and 666 to voltage $V_{AGO}-V_{AG}$. Switches 670, 672 and 674 are enabled during clock phase $P_2$ to discharge capacitors 664 and 666 across capacitors 610 and 612 for driving outputs 514 and 516 to desired output common-mode voltage $V_{AGO}$. In effect, load balancing circuit 606 produces a complementary refresh cycle in which outputs 514 and 516 are precharged and discharged on phases $P_1$ and $P_2$, respectively, to balance the refresh cycle of refresh circuit 604 in which outputs 514 and 516 are precharged and discharged on phases $P_2$ and $P_1$, respectively. Load balancing circuit 606 selectively switches a capacitance to load outputs 514 and 516 during clock phase $P_2$ to match the capacitance switched to outputs 514 and 516 by refresh circuit 604 during clock phase $P_1$. In particular, outputs 514 and 516 are loaded during clock phase $P_1$ by capacitors 610, 612, 614 and 616 and during clock phase $P_2$ by capacitors 610, 612, 664 and 666. Recall that capacitors 614 and 616 are respectively matched to capacitors 664 and 666. As a result of the operation of load balancing circuit 606, outputs 514 and 516 are refreshed on both clock phases $P_1$ and $P_2$, rather than only on clock phase $P_1$.

The matched loads produced across outputs 514 and 516 by load balancing circuit 606 ensure that ADC stages 220 in channel 202 have the same frequency response when sampling input signals as the ADC stages 222 in channel 204 when producing output data. Similarly, ADC stages 222 of channel 204 have the same frequency response when sampling input signals as ADC stages 220 of channel 202 when producing output data. The symmetry in frequency responses effectively reduces or eliminates spurious data errors when data from channels 202 and 204 is interleaved to form digital data stream DATA.

In summary, the present invention reduces data errors in a multiple channel time-interleaved ADC, where each channel comprises a pipelined array of differential ADC stages. Data produced in a first channel during a first clock phase is interleaved with data produced by a second channel during a second clock phase such that data is generated on the first and second clock phases. The data is interleaved to produce a data stream at the output of the ADC. A capacitance in a refresh circuit of a differential ADC stage in the first channel is precharged to a desired common-mode voltage during the second clock phase and discharged across a differential output of the ADC stage during the first clock phase. The discharging produces a greater load at the output of the differential ADC stage during the second clock phase than during the first clock phase. The difference in loads produces different frequency responses during the first and second clock phases which results in spurious data errors when data from the first channel is combined with data from the second channel to form the output data stream. A load balancing circuit selectively switches a load to the output during the first clock phase to match the load produced by the refresh circuit during the second clock phase. The matched loads produce matching frequency responses and reduced spurious data errors.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, the time-interleaved ADC described herein comprises two parallel channels. However, the principles of the present invention can be applied to implement other time-interleaved differential circuits such as switched capacitor filters which have a greater number of parallel channels and a corresponding number of clock phases.

What is claimed is:

1. An integrated circuit, comprising:
   an amplifier having a first input coupled for receiving an input signal and having a first output for providing an output signal;
   a first switched capacitor circuit having a first control input responsive to a first clock signal for coupling the first switched capacitor circuit to a first reference conductor during a first time period, and a second control input responsive to a second clock signal for coupling the first switched capacitor circuit to the first output of the amplifier during a second time period; and
   a second switched capacitor circuit having a first control input responsive to the second clock signal for coupling the second switched capacitor circuit to the first reference conductor during the second time period, and a second control input responsive to the first clock signal for coupling the second switched capacitor circuit to the first output during the first time period.

2. The integrated circuit of claim 1, wherein the second switched capacitor circuit is matched to the first switched capacitor circuit.

3. The integrated circuit of claim 2, further comprising:
   a sensing node coupled a common-mode input of the amplifier;
   a third switched capacitor circuit having a first control input responsive to the first clock signal for coupling the third switched capacitor circuit across the first reference conductor and a second reference conductor during the first time period, and a second control input responsive to the second clock signal for coupling the third switched capacitor circuit between a second output of the amplifier and the sensing node during the second time period; and
   a fourth switched capacitor circuit having a first control input responsive to the second clock signal for coupling the fourth switched capacitor circuit across the first and second reference conductors during the second time period, and a second control input responsive to the first clock signal for coupling the fourth switched capacitor circuit between the second output of the amplifier and the sensing node during the first time period.

4. The integrated circuit of claim 3, further comprising:
   a first capacitor coupled between the first output and the sensing node; and a second capacitor coupled between the second output and the sensing node.

5. The integrated circuit of claim 4, wherein the second capacitor is matched to the first capacitor.

6. The integrated circuit of claim 5, wherein the fourth switched capacitor circuit is matched to the third switched capacitor circuit.

7. An integrated analog to digital converter (ADC), comprising:

a first comparator having first and second inputs coupled for comparing an analog input signal to a reference voltage to produce a first digital data bit;

a first ADC stage having a first input coupled for sampling the analog input signal during a first time period and producing a first residue signal at an output during a second time period, the first ADC stage including,
  (1) a first amplifier having a first input coupled for receiving the analog input signal and a first output for providing the first residue signal;
  (2) a first switched capacitor circuit having a first control input responsive to a first clock signal for coupling the first switched capacitor circuit to a first reference conductor during the first time period, and a second control input responsive to a second clock signal for coupling the first switched capacitor circuit to the first output of the first amplifier during the second time period; and
  (3) a second switched capacitor circuit having a first control input responsive to the second clock signal for coupling the second switched capacitor circuit to the first reference conductor during the second time period, and a second control input responsive to the first clock signal for coupling the second switched capacitor circuit to the first output of the first amplifier during the first time period.

8. The integrated ADC of claim 7, wherein the first switched capacitor circuit is matched to the second switched capacitor circuit.

9. The integrated ADC of claim 8, wherein the first ADC stage further comprises:

a first sensing node coupled a common-mode input of the first amplifier;

a third switched capacitor circuit having a first control input responsive to the first clock signal for coupling the third switched capacitor circuit across the first reference conductor and a second reference conductor during the first time period, and a second control input responsive to the second clock signal for coupling the third switched capacitor circuit between a second output of the first amplifier and the first sensing node during the second time period; and a fourth switched capacitor circuit having a first control input responsive to the second clock signal for coupling the fourth switched capacitor circuit across the first and second reference conductors during the second time period, and a second control input responsive to the first clock signal for coupling the fourth switched capacitor circuit between the second output of the first amplifier and the first sensing node during the first time period.

10. The integrated ADC of claim 9, further comprising:

a second comparator having first and second inputs coupled for comparing the analog input signal to the reference voltage to produce a second digital data bit;

a second ADC stage having a first input coupled for sampling the analog input signal during the second time period and producing a second residue signal at an output during the first time period, the second ADC stage including,
  (1) a second amplifier having a first input coupled for receiving the analog input signal and having a first output for providing the second residue signal;
  (2) a fifth switched capacitor circuit having a first control input responsive to the second clock signal for coupling the fifth switched capacitor circuit to the first reference conductor during the second time period, and a second control input responsive to the first clock signal for coupling the fifth switched capacitor circuit to the first output of the second amplifier during the first time period; and
  (3) a sixth switched capacitor circuit having a first control input responsive to the first clock signal for coupling the sixth switched capacitor circuit to the first reference conductor during the first time period, and a second control input responsive to the second clock signal for coupling the sixth switched capacitor circuit to the first output of the second amplifier during the second time period.

11. The integrated ADC of claim 10, wherein the second ADC stage further comprises:

a second sensing node coupled a common-mode input of the second amplifier;

a seventh switched capacitor circuit having a first control input responsive to the second clock signal for coupling the seventh switched capacitor circuit across the first and second reference conductors during the second time period, and a second control input responsive to the first clock signal for coupling the seventh switched capacitor circuit between a second output of the second amplifier and the second sensing node during the first time period; and a eighth switched capacitor circuit having a first control input responsive to the first clock signal for coupling the eighth switched capacitor circuit across the first and second reference conductors during the first time period, and a second control input responsive to the second clock signal for coupling the eighth switched capacitor circuit between the second output of the second amplifier and the second sensing node during the second time period.

12. A wireless communication device, comprising:

a receiver circuit having an input coupled for receiving a radio frequency carrier signal and an output for providing an analog carrier signal;

an analog-to-digital converter (ADC), including,
  (1) a first differential amplifier having a differential input for sampling the analog carrier signal during a first clock phase;
  (2) a first switched capacitor circuit having first and second control inputs for respectively coupling the first switched capacitor circuit across first and second common-mode reference conductors during a second clock phase, and across a differential output of the first differential amplifier during the first clock phase;
  (3) a second switched capacitor circuit having first and second control inputs for respectively coupling the second switched capacitor circuit across the first and second common-mode reference conductors during the first clock phase, and across the differential output of the first differential amplifier during the first clock phase;
  (4) a first comparator having an input for receiving the analog carrier signal and providing a first data word during the second clock phase to an output of the ADC;

(5) a second differential amplifier having a differential input for sampling the analog carrier signal during the second clock phase;

(6) a third switched capacitor circuit having first and second control inputs for respectively coupling the third switched capacitor circuit across the first and second common-mode reference conductors during the first clock phase, and across a differential output of the second differential amplifier during the second clock phase;

(7) a fourth switched capacitor circuit having first and second control inputs for respectively coupling the fourth switched capacitor circuit across the first and second common-mode reference conductors during the second clock phase, and across the differential output of the second differential amplifier during the first clock phase;

(8) a second comparator having an input for receiving the analog carrier signal and providing a second data word to the output of the ADC during the first clock phase; and a demodulator having an input coupled to the output of the ADC and an output for providing a demodulated signal.

13. The wireless communication device of claim 12, wherein the wireless communication device comprises a pager.

14. A method of refreshing a common-mode voltage at a first output of an amplifier circuit, comprising the steps of:

precharging a first capacitance to a desired common-mode voltage during a first clock phase;

discharging the first capacitance at the first output during a second clock phase;

precharging a second capacitance to the desired common-mode voltage during a second clock phase; and discharging the second capacitance at the first output during the first clock phase.

15. The method of claim 14, wherein the step of discharging the first capacitance includes discharging the first capacitance across a third capacitance.

16. The method of claim 15, wherein the step of discharging the second capacitance includes discharging the second capacitance across the third capacitance.

17. The method of claim 16, further comprising a step of matching the first capacitance to the second capacitance.

18. The method of claim 17, further comprising the steps of:

precharging a fourth capacitance to the desired common-mode voltage during the first clock phase;

discharging the fourth capacitance at a second output of the amplifier circuit during the second clock phase;

precharging a fifth capacitance to the desired common-mode voltage during the second clock phase; and discharging the fifth capacitance at the second output during the first clock phase.

19. The method of claim 18, wherein the step of discharging the fourth capacitance includes discharging the fourth capacitance across a sixth capacitance.

20. The method of claim 19, wherein the step of discharging the fifth capacitance includes discharging the fifth capacitance across the sixth capacitance.

21. The method of claim 20, further comprising the steps of:

matching the fourth capacitance to the fifth capacitance;

matching first capacitance to the fourth capacitance; and matching the third capacitance to the sixth capacitance.

* * * * *